United States Patent
Yoo et al.

(10) Patent No.: US 9,130,005 B2
(45) Date of Patent: Sep. 8, 2015

(54) BIPOLAR JUNCTION TRANSISTOR AND METHOD OF MANUFACTURING THE SAME

(75) Inventors: Jae Hyun Yoo, Seoul (KR); Jong Min Kim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 573 days.

(21) Appl. No.: 13/345,966

(22) Filed: Jan. 9, 2012

(65) Prior Publication Data

US 2013/0049169 A1 Feb. 28, 2013

(30) Foreign Application Priority Data

Aug. 29, 2011 (KR) .................. 10-2011-00864011

(51) Int. Cl.
- *H01L 29/73* (2006.01)
- *H01L 29/735* (2006.01)
- *H01L 29/08* (2006.01)
- *H01L 29/10* (2006.01)

(52) U.S. Cl.
CPC .......... *H01L 29/735* (2013.01); *H01L 29/0821* (2013.01); *H01L 29/1008* (2013.01)

(58) Field of Classification Search
None
See application file for complete search history.

(56) References Cited

U.S. PATENT DOCUMENTS

| | | | | |
|---|---|---|---|---|
| 6,815,800 B2* | 11/2004 | Mallikarjunaswamy | ..... | 257/565 |
| 8,513,737 B2* | 8/2013 | Sawahata | ...................... | 257/355 |
| 8,648,419 B2* | 2/2014 | Gendron et al. | ............... | 257/355 |
| 2004/0253779 A1* | 12/2004 | Hong | ............................ | 438/203 |
| 2007/0105301 A1* | 5/2007 | Chen et al. | .................... | 438/234 |
| 2007/0148892 A1 | 6/2007 | Otake et al. | | |
| 2007/0246739 A1 | 10/2007 | Otake | | |
| 2008/0093707 A1 | 4/2008 | Terashima et al. | | |
| 2010/0301453 A1* | 12/2010 | Chung et al. | .................. | 257/574 |
| 2011/0121428 A1* | 5/2011 | Lin et al. | ....................... | 257/592 |
| 2013/0277805 A1* | 10/2013 | Hung et al. | ................... | 257/588 |

FOREIGN PATENT DOCUMENTS

| | | |
|---|---|---|
| JP | 2007-180243 | 7/2007 |
| JP | 2008-103551 | 5/2008 |
| KR | 10-2004-0095928 | 11/2004 |
| KR | 10-2007-0104834 | 10/2007 |

* cited by examiner

*Primary Examiner* — Matthew W Such
*Assistant Examiner* — Abul Kalam
(74) *Attorney, Agent, or Firm* — Sherr & Jiang, PLLC

(57) ABSTRACT

A bipolar junction transistor includes a first trench element isolation film, a second trench element isolation film, a first base region, a second base region, a collector region, a first well, a second well, an emitter, a collector, and bases. The second well is formed by implanting an n-type impurity into the semiconductor substrate, and the emitter is formed by implanting the n-type impurity into the emitter region between the first trench element isolation film and the second well. The collector is formed by implanting the n-type impurity into the collector region between the first well and the second trench element isolation film, and the bases are formed by implanting the p-type impurity into the first base region and into the second base region between the emitter region and the second well.

8 Claims, 7 Drawing Sheets

BIPOLAR JUNCTION TRANSISTOR AND METHOD OF MANUFACTURING THE SAME

The present application claims priority to Korean Patent Application No. 10-2011-0086401 (filed on Aug. 29, 2011), which is hereby incorporated by reference in its entirety.

BACKGROUND

Generally, a bipolar junction transistor improves in current performance, speed, and gain as compared to a metal oxide semiconductor transistor, and is thus widely used when designing an analog power RF IC.

A bipolar junction transistor having an emitter, a base, and a collector is classified into a vertical bipolar junction transistor and a lateral bipolar junction transistor depending on the traveling direction of electric charges emitted from the emitter.

The bipolar junction transistor is used as an electrostatic discharge protection element which protects an internal IC circuit.

FIG. 1 is a sectional view illustrating a lateral bipolar junction transistor as an electrostatic discharge protection element in the related art. FIG. 1 shows an npn-type bipolar junction transistor.

As illustrated in FIG. 1, a bipolar junction transistor for an electrostatic discharge protection element in the related art includes a first trench element isolation film 14, a second trench element isolation film 15, and a third trench element isolation film 16 which are formed on a p-type semiconductor substrate 11, and define an emitter region, a base region, and a collector region.

A p-type impurity is implanted into the emitter region and the base region including the first trench element isolation film 14 of the semiconductor substrate 11 to form a first well 12.

An n-type impurity is implanted into the collector region including the third trench element isolation film 16 of the semiconductor substrate 11 to form a second well 13.

A p-type impurity is implanted into the base region between the first trench element isolation film 14 and the second trench element isolation film 15 to form a base 19.

An n-type impurity is implanted into the collector region between the first well 12 and the third trench element isolation film 16 to form a collector 18.

An n-type impurity is implanted into the emitter region isolated from the base region by the first trench element isolation film 14 to form an emitter 17.

When the bipolar junction transistor is used as an electrostatic discharge protection element, an input/output (I/O) terminal should be constituted at the time of circuit design. The collector is connected to the input/output terminal, the emitter is connected to the ground terminal, and the base is connected to the ground terminal through a resistor.

The bipolar junction transistor for an electrostatic discharge protection element is used to protect a semiconductor device from static electricity. If an electrostatic voltage equal to or higher than 2000 V is input to the input/output terminal, the bipolar junction transistor rapidly discharges an electrostatic current to the ground terminal. For this reason, in order to use the bipolar junction transistor as an electrostatic discharge protection element, the parameters, such as a triggering voltage Vt, a holding voltage Vh, and a breakdown voltage Vb, must be satisfied.

On the other hand, a lateral bipolar junction transistor exhibits unsatisfactory characteristics as compared to a vertical bipolar junction transistor from the viewpoint of electrostatic discharge protection performance.

Accordingly, in the related art, as illustrated in a sectional view of FIG. 2, the positions of the emitter 17 and the base 19 are reversed. As illustrated in FIG. 2, if the positions of the emitter and the base are reversed, the tunneling effect of the bipolar junction transistor appears faster than that of FIG. 1, such that the triggering time can be advanced.

However, even when the positions of the emitter and the base are reversed, it is difficult to secure a satisfactory electrostatic discharge protection. For this reason, the size of the bipolar junction transistor must still be increased.

The increase in the size of the bipolar junction transistor leads to an increase in the size of the semiconductor device. Accordingly, there is a limit to which the size of the bipolar junction transistor may be increased before it becomes undesirable.

SUMMARY

Embodiments relate to a bipolar junction transistor (BJT), and more particularly, to a bipolar junction transistor and a method of manufacturing the same capable of improving electrostatic discharge protection performance without causing an increase in the size of a lateral bipolar junction transistor as an electrostatic discharge protection element.

Embodiments relate to changing the structure of a lateral bipolar junction transistor as an electrostatic discharge protection element to improve electrostatic discharge protection performance without a resulting increase in size.

Embodiments relate to a method of manufacturing a lateral bipolar junction transistor as an electrostatic discharge protection element.

In accordance with embodiments, there is provided a bipolar junction transistor including: a first trench element isolation film and a second trench element isolation film which are formed on and/or over a p-type semiconductor substrate, and which define an emitter region, a first base region, a second base region, and a collector region; a first well which is formed by implanting a p-type impurity into the semiconductor substrate including the first trench element isolation film, the emitter region, the first base region, and the second base region; a second well which is formed by implanting an n-type impurity into the semiconductor substrate including the second trench element isolation film and the collector region; an emitter which is formed by implanting the n-type impurity into the emitter region between the first trench element isolation film and the second well; a collector which is formed by implanting the n-type impurity into the collector region between the first well and the second trench element isolation film; and bases which are formed by implanting the p-type impurity into the first base region isolated from the emitter region by the first trench element isolation film and into the second base region between the emitter region and the second well.

In accordance with embodiments, there is provided a bipolar junction transistor including: a first trench element isolation film and a second trench element isolation film which are formed on and/or over a p-type semiconductor substrate, and define an emitter region, a first base region, a second base region, and a collector region; a first well which is formed by implanting a p-type impurity into the semiconductor substrate including the first trench element isolation film, the emitter region, the first base region, and the second base region; a second well which is formed by implanting an n-type impurity into the semiconductor substrate including the second trench element isolation film and the collector region; bases which are formed by implanting the p-type impurity into the first base region and the second base region arranged in order between the first trench element isolation film and the second well; a collector which is formed by implanting the n-type impurity into the collector region between the first well and the second trench element isolation film; an emitter which is formed by implanting the n-type impurity into the emitter region isolated from the first base region by the first trench element isolation film; and a third well which is formed by implanting the p-type impurity into the first well to surround the second base region; and implanting the n-type impurity into the second cell to form a fourth well below the collector region and the second trench element isolation film.

The bipolar junction transistor may further include a fifth well which is formed along the boundary of the semiconductor substrate by implanting the n-type impurity from below the third well and to below the fourth well.

The bipolar junction transistor may further include a third trench element isolation film which is formed between the first base region and the second base region.

In accordance with embodiments, there is provided a method of manufacturing a bipolar junction transistor, the method including: forming a first trench element isolation film and a second trench element isolation film on and/or over a p-type semiconductor substrate to define an emitter region, a first base region, a second base region, and a collector region; implanting a p-type impurity into the semiconductor substrate including the first trench element isolation film, the emitter region, and the base region to form a first well; implanting an n-type impurity into the semiconductor substrate including the second trench element isolation film and the collector region to form a second well; implanting the n-type impurity into the emitter region between the first trench element isolation film and the second well to form an emitter; implanting the n-type impurity into the collector region between the first well and the second trench element isolation film to form a collector; and implanting the p-type impurity into the first base region isolated from the emitter region by the first trench element isolation film and into the second base region between the emitter region and the second well to form bases.

Embodiments may further include, after forming of the first well, implanting the p-type impurity into the first well to form a third well to surround the second base region; and after forming of the second well, implanting the n-type impurity into the second well to form a fourth well below the collector region and the second trench element isolation film.

Embodiments may further include implanting the n-type impurity from below the third well to below the fourth well to form a fifth well along the boundary of the semiconductor substrate.

Embodiments may further include forming a third trench element isolation film between the emitter region and the second base region.

In accordance with embodiments, there is provided a method of manufacturing a bipolar junction transistor, the method including: forming a first trench element isolation film and a second trench element isolation film on and/or over a p-type semiconductor substrate to define an emitter region, a first base region, a second base region, and a collector region; implanting a p-type impurity into the semiconductor substrate including the first trench element isolation film, the emitter region, the first base region, and the second base region to form a first well; implanting the p-type impurity into the first well to form a third well to surround the second base region; implanting an n-type impurity into the semiconductor substrate including the second trench element isolation film and the collector region to form a second well; implanting the n-type impurity into the second well to form a fourth well below the collector region and the second trench element isolation film; implanting the p-type impurity into the first base region and the second base region arranged in order between the first trench element isolation film and the second well to form bases; implanting the n-type impurity into the collector region between the first well and the second trench element isolation film to form a collector; and implanting the n-type impurity into the emitter region isolated from the first base region by the first trench element isolation film to form an emitter.

Embodiments may further include, prior to forming the base, implanting the n-type impurity from below the third well to below the fourth well to form a fifth well along the boundary of the semiconductor substrate.

Embodiments may further include, prior to forming the first well, forming a third trench element isolation film between the first base region and the second base region.

In accordance with embodiments, the triggering voltage can be easily adjusted to improve the capability to decrease the triggering voltage, base resistance can be reduced to increase the holding voltage, and a deep current path to the lower end of the base can be formed. Therefore, it is possible to improve electrostatic discharge protection performance without causing an increase in the size of the bipolar junction transistor.

DRAWINGS

Figure 3:
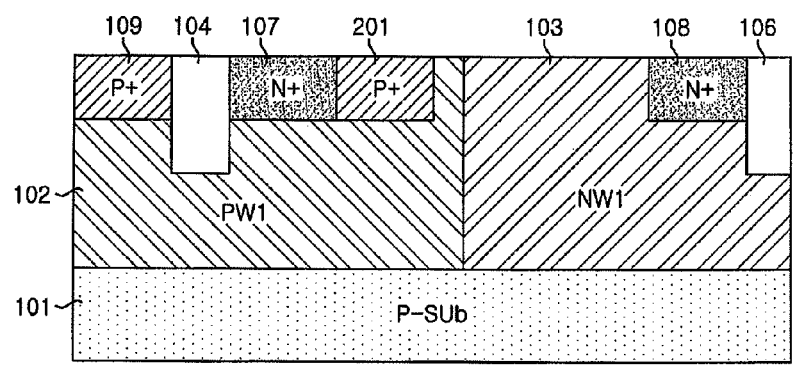

Example FIG. 3 is a sectional view illustrating a lateral bipolar junction transistor as an electrostatic discharge protection element according to embodiments.

Figure 4:
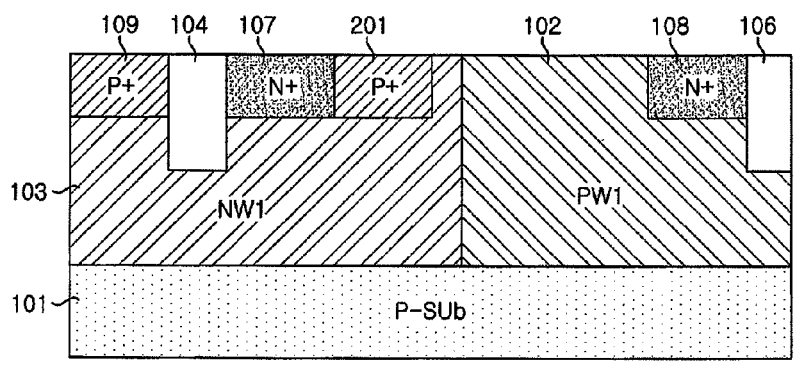

Example FIG. 4 is a sectional view illustrating a lateral bipolar junction transistor as an electrostatic discharge protection element according to embodiments.

Figure 5:
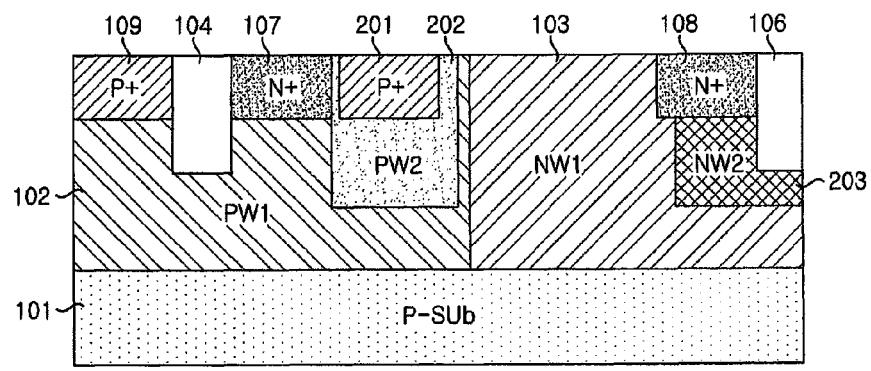

Example FIG. 5 is a sectional view illustrating a lateral bipolar junction transistor as an electrostatic discharge protection element according to embodiments.

Figure 6:
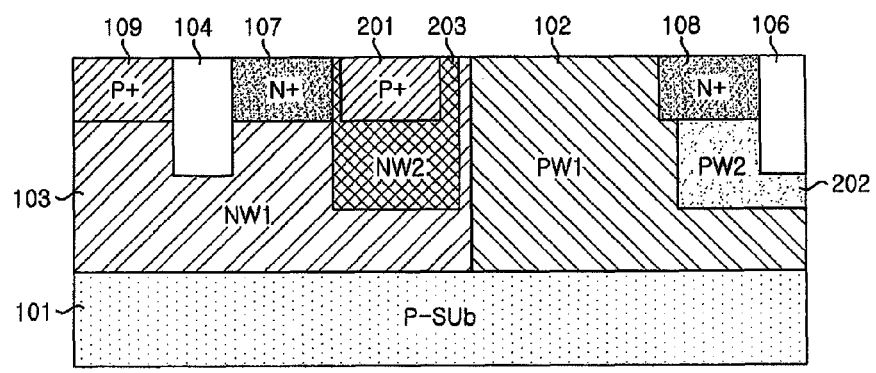

Example FIG. 6 is a sectional view illustrating a lateral bipolar junction transistor as an electrostatic discharge protection element according to embodiments.

Figure 7:
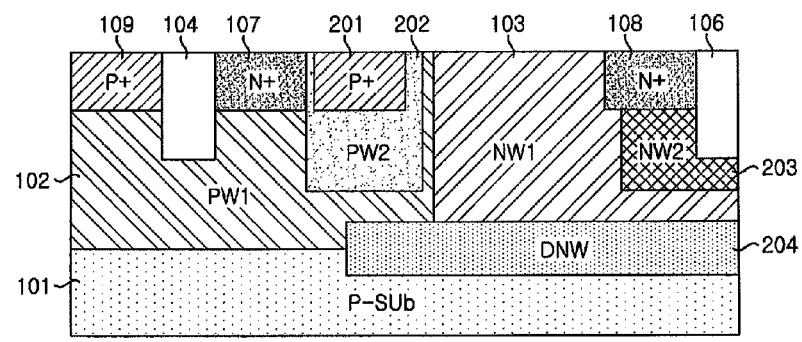

Example FIG. 7 is a sectional view illustrating a lateral bipolar junction transistor as an electrostatic discharge protection element according to embodiments.

Figure 8:
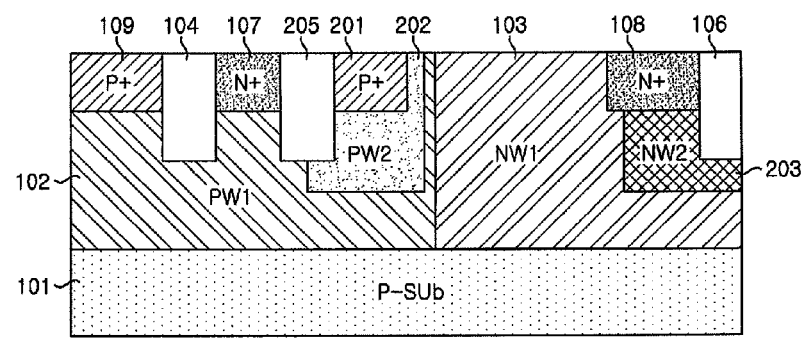

Example FIG. 8 is a sectional view illustrating a lateral bipolar junction transistor as an electrostatic discharge protection element according to embodiments.

Figure 9:
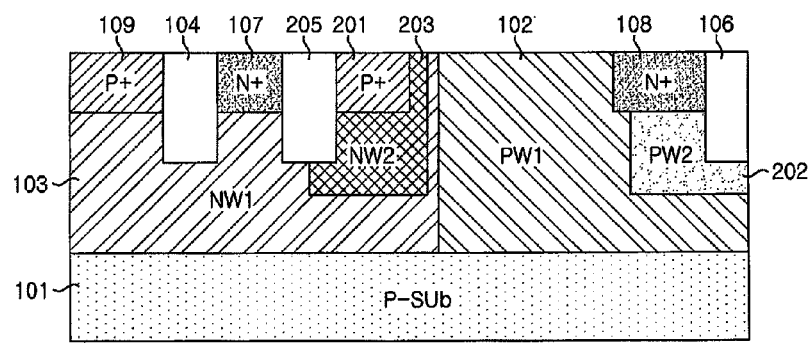

Example FIG. 9 is a sectional view illustrating a lateral bipolar junction transistor as an electrostatic discharge protection element according to embodiments.

Figure 10:
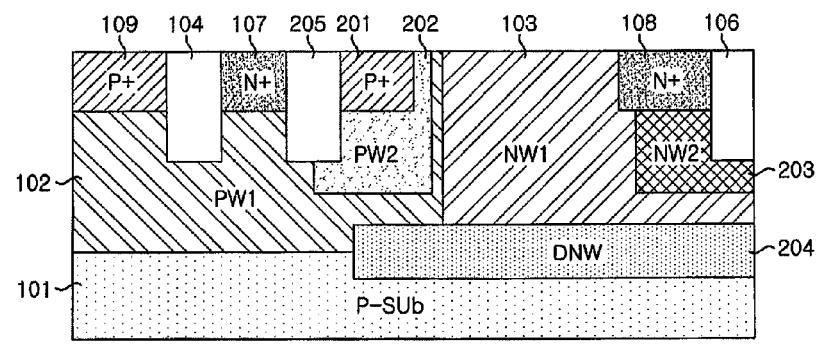

Example FIG. 10 is a sectional view illustrating a lateral bipolar junction transistor as an electrostatic discharge protection element according to embodiments.

Figure 11:
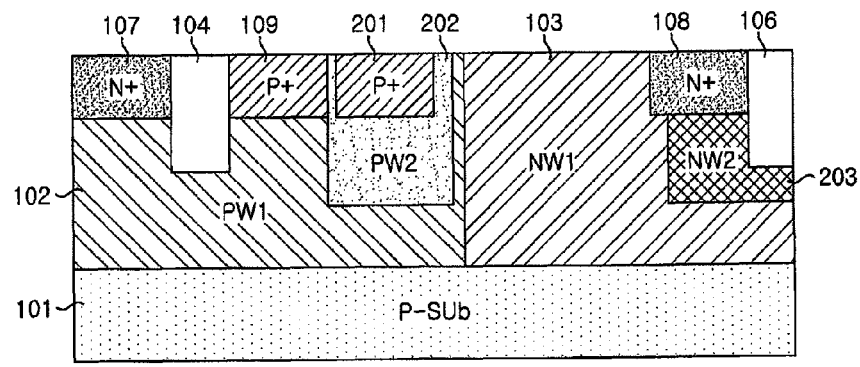

Example FIG. 11 is a sectional view illustrating a lateral bipolar junction transistor as an electrostatic discharge protection element according to embodiments.

Figure 12:
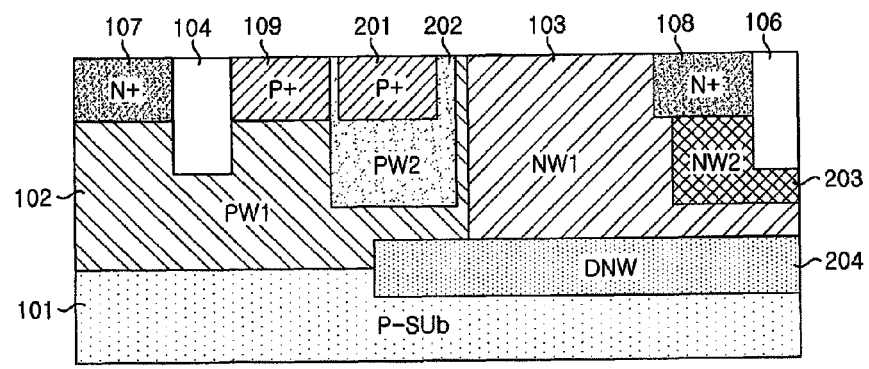

Example FIG. 12 is a sectional view illustrating a lateral bipolar junction transistor as an electrostatic discharge protection element according to embodiments.

Figure 13:
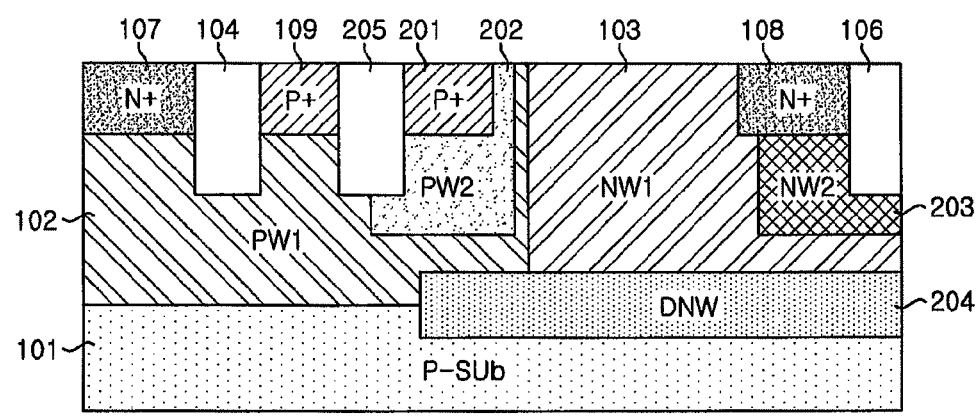

Example FIG. 13 is a sectional view illustrating a lateral bipolar junction transistor as an electrostatic discharge protection element according to embodiments.

DESCRIPTION

Advantages and features of the invention and methods of accomplishing the same may be understood more readily by reference to the following detailed description of embodiments and the accompanying drawings. The invention may, however, be embodied in many different forms and should not be construed as being limited to the embodiments set forth herein. Rather, these embodiments are provided so that this disclosure will be more readily understood by those skilled in the art, and the invention will only be defined by the appended claims.

Example FIG. 3 is a sectional view illustrating a lateral bipolar junction transistor as an electrostatic discharge protection element according to embodiments. Example FIG. 3 illustrates an npn-type bipolar junction transistor.

As illustrated in Example FIG. 3, the bipolar junction transistor according to embodiments includes a first trench element isolation film 104 and a second trench element isolation film 106 which are formed on and/or over a p-type semiconductor substrate 101 to define an emitter region, a first base region, a second base region, and a collector region, a first well 102 which is formed by implanting p-type impurity ions into the semiconductor substrate 101 including the emitter region, the first base region, and the second base region, a second well 103 which is formed by implanting n-type impurity ions into the semiconductor substrate 101 including the second trench element isolation film 106 and the collector region, an emitter 107 which is formed by implanting the n-type impurity ions into the emitter region between the first trench element isolation film 104 and the second well 103, a collector 108 which is formed by implanting the n-type impurity ions into the collector region between the first well 102 and the second trench element isolation film 106, and bases 109 and 201 which are formed by implanting the p-type impurity ions into the first base region isolated from the emitter region by the first trench element isolation film 104 and into the second base region between the emitter region and the second well 103.

A process for manufacturing the bipolar junction transistor according to embodiments will now be described in detail with reference to example FIG. 3.

First, the first trench element isolation film 104 and the second trench element isolation film 106 are formed on and/or over the p-type semiconductor substrate 101 to define the emitter region, the first base region, the second base region, and the collector region.

Next, the p-type impurity ions are implanted into the semiconductor substrate 101 including the first trench element isolation film 104, the emitter region, and the first and second base regions to form the first well 102, and the n-type impurity ions are implanted into the semiconductor substrate 101 including the second trench element isolation film 106 and the collector region to form the second well 103.

Next, the n-type impurity ions are implanted into the emitter region between the first trench element isolation film 104 and the second well 103 to form the emitter 107.

The n-type impurity ions are implanted into the collector region between the first well 102 and the second trench element isolation film 106 to form the collector 108.

The p-type impurity ions are implanted into the first base region isolated from the emitter region where the emitter 107 is formed by the first trench element isolation film 104 and into the second base region between the emitter region where the emitter 107 is formed and the second well 103 to form the bases 109 and 201.

Figure 2:
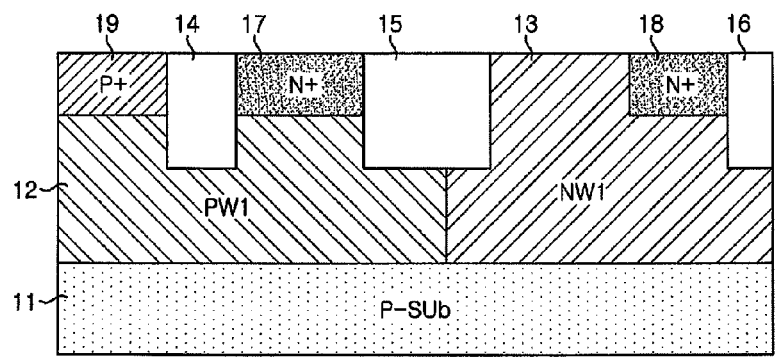
FIG. 2 is a sectional view illustrating a lateral bipolar junction transistor as an electrostatic discharge protection element in the related art.

When comparing the bipolar junction transistor of example FIG. 3 according to embodiments with the bipolar junction transistor of FIG. 2 according to the related art, it can be seen that the second trench element isolation film 15 in the boundary region of the P-type well 12 and the N-type 13 is removed, and the base 201 is further formed in the second base region of the first well 102.

Figure 1:
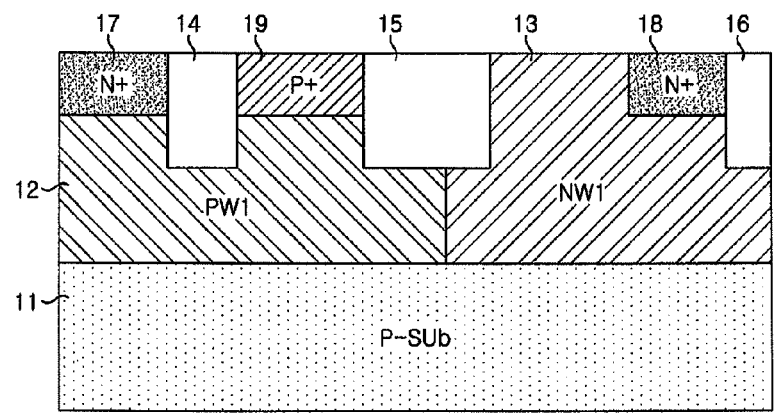
FIG. 1 is a sectional view illustrating a lateral bipolar junction transistor as an electrostatic discharge protection element in the related art.

In the bipolar junction transistor according to embodiments, the positions of the emitter 107 and the base 109 are changed, and the tunneling effect appears rapidly as compared to the bipolar junction transistor of FIG. 1 according to the related art, such that the triggering time can be advanced. The triggering voltage Vt can be adjusted by the first well 102, the second well 103, and the base 201, thereby improving the capability to decrease the triggering voltage Vt.

With the addition of the base 201, base resistance is reduced, resulting in an increase in the holding voltage Vh.

In a structure in which no base 201 is added, electrons emitted from the emitter 107 are crowded on the surfaces of the first well 102 and the second well 103. Meanwhile, with the addition of the base 201, a deep current path to the lower end of the base 201 is formed. The deep current path results in an increase in the breakdown voltage Vh.

Example FIG. 4 is a sectional view illustrating a lateral bipolar junction transistor as an electrostatic discharge protection element according to embodiments. Example FIG. 4 illustrates a pnp type which is a modification to the bipolar junction transistor illustrated in FIG. 3.

Example FIG. 5 is a sectional view illustrating a lateral bipolar junction transistor as an electrostatic discharge protection element according to embodiments. Example FIG. 5 illustrates an npn-type bipolar junction transistor.

As illustrated in example FIG. 5, the bipolar junction transistor according to embodiments includes a first trench element isolation film 104 and a second trench element isolation film 106 which are formed on and/or over a p-type semiconductor substrate 101 to define an emitter region, a first base region, a second base region, and a collector region, a first well 102 which is formed by implanting p-type impurity ions into the semiconductor substrate 101 including the emitter region, the first base region, and the second base region, a second well 103 which is formed by implanting n-type impurity ions into the semiconductor substrate 101 including the second trench element isolation film 106 and the collector region, an emitter 107 which is formed by implanting the n-type impurity ions into the emitter region between the first trench element isolation film 104 and the second well 103, a collector 108 which is formed by implanting the n-type impurity ions into the collector region between the first well 102 and the second trench element isolation film 106, bases 109 and 201 which are formed by implanting the p-type impurity ions into the first base region isolated from the emitter region by the first trench element isolation film 104 and into the second base region between the emitter region and the second well 103, a third well 202 which is formed by implanting the p-type impurity ions into the first well 102 to surround the base 201 (second base region), and a fourth well 203 which is formed below the collector 108 (collector region) and the second trench element isolation film 106 by implanting the n-type impurity ions into the second well 103.

A process of manufacturing the bipolar junction transistor according to embodiments is described as follows.

First, the first trench element isolation film 104 and the second trench element isolation film 106 are formed on and/ or over the p-type semiconductor substrate 101 to define the emitter region, the first base region, the second base region, and the collector region.

Next, the p-type impurity ions are implanted into the semiconductor substrate 101 including the first trench element isolation film 104, the emitter region, and the first and second base regions to form the first well 102, and the p-type impurity ions are implanted into the first well 102 to form the third well 202 to surround the second base region where the base 201 will be formed in a subsequent step.

Next, the n-type impurity ions are implanted into the semiconductor substrate 101 including the second trench element isolation film 106 and the collector region to form the second well 103, and the n-type impurity ions are implanted into the second well 103 to form the fourth well 203 below the collector region where the collector 108 will be formed in a subsequent step and the second trench element isolation film 106.

Next, the n-type impurity ions are implanted into the emitter region between the first trench element isolation film 104 and the second well 103 to form the emitter 107.

The n-type impurity ions are implanted into the collector region between the first well 102 and the second trench element isolation film 106 to form the collector 108.

The p-type impurity ions are implanted into the first base region isolated from the emitter region where the emitter 107 is formed by the first trench element isolation film 104 and into the second base region between the emitter region where the emitter 107 is formed and the second well 103 to form the bases 109 and 201.

When comparing the bipolar junction transistor illustrated in example FIG. 5 according to embodiments with the bipolar junction transistor illustrated in example FIG. 3, it can be seen that the third well 202 and the fourth well 203 are further formed.

In the bipolar junction transistor according to embodiments, the triggering voltage Vt can be adjusted by the first well 102, the second well 103, the third well 202, and the base 201 as compared to the bipolar junction transistor illustrated in example FIG. 3, further improving the capability to decrease the triggering voltage Vt.

Example FIG. 6 is a sectional view illustrating a lateral bipolar junction transistor as an electrostatic discharge protection element according to embodiments. Example FIG. 6 illustrates a pnp type which is a modification to the bipolar junction transistor illustrated in example FIG. 5.

Example FIG. 7 is a sectional view illustrating a lateral bipolar junction transistor as an electrostatic discharge protection element according to embodiments. Example FIG. 7 illustrates an npn-type bipolar junction transistor.

As illustrated in example FIG. 7, the bipolar junction transistor according to embodiments includes a first trench element isolation film 104 and a second trench element isolation film 106 which are formed on and/or over a p-type semiconductor substrate 101 to define an emitter region, a first base region, a second base region, and a collector region, a first well 102 which is formed by implanting p-type impurity ions into the semiconductor substrate 101 including the emitter region, the first base region, and the second base region, a second well 103 which is formed by implanting n-type impurity ions into the semiconductor substrate 101 including the second trench element isolation film 106 and the collector region, an emitter 107 which is formed by implanting the n-type impurity ions into the emitter region between the first trench element isolation film 104 and the second well 103, a collector 108 which is formed by implanting the n-type impurity ions into the collector region between the first well 102 and the second trench element isolation film 106, bases 109 and 201 which are formed by implanting the p-type impurity ions into the first base region isolated from the emitter region by the first trench element isolation film 104 and into the second base region between the emitter region and the second well 103, a third well 202 which is formed by implanting the p-type impurity ions into the first well 102 to surround the base 201 (second base region), a fourth well 203 which is formed below the collector 108 (collector region) and the second trench element isolation film 106 by implanting the n-type impurity ions into the second well 103, and a fifth well 204 which is formed along the boundary of the semiconductor substrate 101 by implanting the n-type impurity ions from below the third well 202 to below the fourth well 203.

A process for manufacturing the bipolar junction transistor according to embodiments will now be described in detail with reference to example FIG. 7.

First, the first trench element isolation film 104 and the second trench element isolation film 106 are formed on and/or over the p-type semiconductor substrate 101 to define the emitter region, the first base region, the second base region, and the collector region.

Next, the p-type impurity ions are implanted into the semiconductor substrate 101 including the first trench element isolation film 104, the emitter region, and the first and second base regions to form the first well 102, and the p-type impurity ions are implanted into the first well 102 to form the third well 202 to surround the second base region where the base 201 will be formed in a subsequent step.

Next, the n-type impurity ions are implanted into the semiconductor substrate 101 including the second trench element isolation film 106 and the collector region to form the second well 103, and the n-type impurity ions are implanted into the second well 103 to form the fourth well 203 below the collector region where the collector 108 will be formed in a subsequent step and the second trench element isolation film 106.

Next, the n-type impurity ions are implanted deeply from below the third well 202 to below the fourth well 203 to form the fifth well 204 along the boundary of the semiconductor substrate 101.

Next, the n-type impurity ions are implanted into the emitter region between the first trench element isolation film 104 and the second well 103 to form the emitter 107.

The n-type impurity ions are implanted into the collector region between the first well 102 and the second trench element isolation film 106 to form the collector 108.

The p-type impurity ions are implanted into the first base region isolated from the emitter region where the emitter 107 is formed by the first trench element isolation film 104 and into the second base region between the emitter region where the emitter 107 is formed and the second well 103 to form the bases 109 and 201.

When comparing the bipolar junction transistor illustrated in example FIG. 7 according to embodiments with the bipolar junction transistor illustrated in example FIG. 5, it can be seen that the fifth well 204 is further formed.

When comparing the bipolar junction transistor as illustrated in example FIG. 7 according to embodiments with the bipolar junction transistor illustrated in example FIG. 5, electrons emitted from the emitter 107 form a deep current path to the lower end of the base 201 along the fifth well 204.

Example FIG. 8 is a sectional view illustrating a lateral bipolar junction transistor as an electrostatic discharge protection element according to embodiments. Example FIG. 8 illustrates an npn-type bipolar junction transistor.

As illustrated in example FIG. 8, the bipolar junction transistor according to embodiments includes a first trench element isolation film 104, a second trench element isolation film 106, and a third trench element isolation film 205 which are formed on and/or over a p-type semiconductor substrate 101 to define an emitter region, a first base region, a second base region, and a collector region, a first well 102 which is formed by implanting p-type impurity ions into the semiconductor substrate 101 including the emitter region, the first base region, and the second base region, a second well 103 which is formed by implanting n-type impurity ions into the semiconductor substrate 101 including the second trench element isolation film 106 and the collector region, an emitter 107 which is formed by implanting the n-type impurity ions into the emitter region between the first trench element isolation film 104 and the third trench element isolation film 205, a collector 108 which is formed by implanting the n-type impurity ions into the collector region between the first well 102 and the second trench element isolation film 106, bases 109 and 201 which are formed by implanting the n-type impurity ions into the first base region isolated from the emitter region by the first trench element isolation film 104 and into the second base region between the third trench element isolation film 205 and the second well 103, a third well 202 which is formed by implanting the p-type impurity ions into the first well 102 to surround the base 201 (second base region), a fourth well 203 which is formed below the collector 108 (collector region) and the second trench element isolation film 106 by implanting the n-type impurity ions into the second well 103.

A process for manufacturing the bipolar junction transistor according to embodiments will now be described in detail with reference to example FIG. 8.

First, the first trench element isolation film 104, the second trench element isolation film 106, and the third trench element isolation film 205 are formed on and/or over the p-type semiconductor substrate 101 to define the emitter region, the first base region, the second base region, and the collector region.

Next, the p-type impurity ions are implanted into the semiconductor substrate 101 including the first trench element isolation film 104, the emitter region, and the first and second base regions to form the first well 102, and the p-type impurity ions are implanted into the first well 102 to form the third well 202 to surround the second base region where the base 201 will be formed in a subsequent step.

Next, the n-type impurity ions are implanted into the semiconductor substrate 101 including the second trench element isolation film 106 and the collector region to form the second well 103, and the n-type impurity ions are implanted into the second well 103 to form the fourth well 203 below the collector region where the collector 108 will be formed in a subsequent step and the second trench element isolation film 106.

Next, the n-type impurity ions are implanted into the emitter region between the first trench element isolation film 104 and the third trench element isolation film 205 to form the emitter 107.

The n-type impurity ions are implanted into the collector region between the first well 102 and the second trench element isolation film 106 to form the collector 108.

The p-type impurity ions are implanted into the first base region isolated from the emitter region where the emitter 107 is formed by the first trench element isolation film 104 and into the second base region between the third trench element isolation film 205 and the second well 103 to form the bases 109 and 201.

When comparing the bipolar junction transistor illustrated in example FIG. 8 according to embodiments with the bipolar junction transistor illustrated in example FIG. 5, it can be seen that the third trench element isolation film 205 is further formed.

With comparing the bipolar junction transistor according to embodiments as illustrated in example FIG. 8 with the bipolar junction transistor illustrated in example FIG. 5, junction breakdown does not appear on the surface and occurs below the third trench element isolation film 205, such that element reliability is relatively improved.

Example FIG. 9 is a sectional view illustrating a lateral bipolar junction transistor as an electrostatic discharge protection element according to embodiments. Example FIG. 9 is a pnp type which is a modification to the bipolar junction transistor illustrated in example FIG. 8.

Example FIG. 10 is a sectional view illustrating a lateral bipolar junction transistor as an electrostatic discharge protection element according to embodiments. In the bipolar junction transistor illustrated in example FIG. 10, a fifth well 204 is further formed in the bipolar junction transistor illustrated in example FIG. 8. The bipolar junction transistor including the fifth well 204 has been described with reference to example FIG. 7, thus detailed description thereof will not be repeated.

In embodiments described with reference to example FIGS. 5, 6, 7, 8, 9, and 10, the positions of the emitter 107 and the base 109 may be reversed. Some modifications of embodiments will be described with reference to example FIGS. 11 to 13.

Example FIG. 11 is a sectional view illustrating a lateral bipolar junction transistor as an electrostatic discharge protection element according to embodiments. Example FIG. 11 illustrates a modification in which the positions of the emitter 107 and the base 109 in the bipolar junction transistor of example FIG. 5 are reversed.

As illustrated in example FIG. 11, the lateral bipolar junction transistor according to embodiments includes a first trench element isolation film 104 and a second trench element isolation film 106 which are formed on and/or over a p-type semiconductor substrate 101 to define an emitter region, a first base region, a second base region, and a collector region, first trench element isolation film 104, the emitter region, a first well 102 which is formed by implanting p-type impurity ions into the semiconductor substrate 101 including the first base region and the second base region, a second well 203 which is formed by implanting n-type impurity ions into the semiconductor substrate 101 including the second trench element isolation film 106 and the collector region, bases 109 and 201 which are formed by implanting the p-type impurity ions into the first base region and the second base region arranged in order between the first trench element isolation film 104 and the second well 103, a collector 108 which is formed by implanting the n-type impurity ions into the collector region between the first well 102 and the second trench element isolation film 106, an emitter 107 which is formed by implanting the n-type impurity ions into the emitter region isolated from the first base region by the first trench element isolation film 104, a third well 202 which is formed by implanting the p-type impurity ions into the first well 102 to surround the second base region, and a fourth well 203 which is formed below the collector region and the second trench element isolation film 106 by implanting the n-type impurity ions into the second well 103.

A process for manufacturing the bipolar junction transistor according to embodiments will now be described in detail with reference to example FIG. 11.

First, the first trench element isolation film 104 and the second trench element isolation film 106 are formed on and/or over the p-type semiconductor substrate 101 to define the emitter region, the first base region, the second base region, and the collector region.

Next, the p-type impurity ions are implanted into the semiconductor substrate 101 including the first trench element isolation film 104, the emitter region, and the first and second base regions to form the first well 102, and the p-type impurity ions are implanted into the first well 102 to form the third well 202 to surround the second base region where the base 201 will be formed in a subsequent step.

Next, the n-type impurity ions are implanted into the semiconductor substrate 101 including the second trench element isolation film 106 and the collector region to form the second well 103, and the n-type impurity ions are implanted into the second well 103 to form the fourth well 203 below the collector region where the collector 108 will be formed in a subsequent step and the second trench element isolation film 106.

Next, the p-type impurity ions are implanted into the first base region and the second base region arranged in order between the first trench element isolation film 104 and the second well 103 to form the bases 109 and 201.

Next, the n-type impurity ions are implanted into the collector region between the first well 102 and the second trench element isolation film 106 to form the collector 108.

Finally, the n-type impurity ions are implanted into the emitter region isolated from the base 109 (first base region) by the first trench element isolation film 104 to form the emitter 107.

Example FIG. 12 is a sectional view illustrating a lateral bipolar junction transistor as an electrostatic discharge protection element according to embodiments. From example FIG. 12, it can be seen that a fifth well 204 is further formed in the bipolar junction transistor of example FIG. 11. The bipolar junction transistor including the fifth well 204 has been described with reference to example FIG. 7, thus detailed description thereof will not be repeated.

Example FIG. 13 is a sectional view illustrating a lateral bipolar junction transistor as an electrostatic discharge protection element according to embodiments. From example FIG. 13, it can be seen that a third trench element isolation film 205 is further formed in the bipolar junction transistor of example FIG. 12. The bipolar junction transistor including the third trench element isolation film 205 has been described with reference to example FIG. 8, thus detailed description thereof will not be repeated.

While the invention has been shown and described with respect to embodiments, it will be understood by those skilled in the art that various changes and modifications may be made without departing from the scope of the invention as defined in the following claims.

What is claimed is:

1. An apparatus comprising:
a first trench element isolation film formed over a p-type semiconductor substrate;
a second trench element isolation film formed over the semiconductor substrate;
a first well formed by implanting a p-type impurity into the semiconductor substrate;
a second well formed by implanting an n-type impurity into the semiconductor substrate;
an emitter formed by implanting the n-type impurity into an emitter region between the first trench element isolation film and the second well;
a collector formed by implanting the n-type impurity into a collector region between the first well and the second trench element isolation film;
a first base formed by implanting the p-type impurity into a first base region isolated from the emitter region by the first trench element isolation film;
a second base formed by implanting the p-type impurity into a second base region between the emitter region and the second well; and
a third well formed by implanting the p-type impurity into the first well to surround the second base region; and
a fourth well formed below the collector region and the second trench element isolation film by implanting the n-type impurity into the second well.

2. The apparatus of claim 1, further comprising:
a fifth well formed along a boundary of the semiconductor substrate by implanting the n-type impurity below the third well and below the fourth well.

3. The apparatus of claim 2, further comprising:
a third trench element isolation film formed between the emitter region and the second base region.

4. The apparatus of claim 1, further comprising:
a third trench element isolation film formed between the emitter region and the second base region.

5. An apparatus comprising:
a first trench element isolation film formed over a p-type semiconductor substrate;
a second trench element isolation film formed over the semiconductor substrate;
a first well formed by implanting a p-type impurity into the semiconductor substrate;
a second well formed by implanting an n-type impurity into the semiconductor substrate;
a first base formed by implanting the p-type impurity into a first base region;
a second base formed by implanting the p-type impurity into a second base region;
a collector formed by implanting the n-type impurity into a collector region between the first well and the second trench element isolation film;
an emitter formed by implanting the n-type impurity into an emitter region that is isolated from the first base region by the first trench element isolation film;
a third well formed by implanting the p-type impurity into the first well to surround the second base region; and
a fourth well formed below the collector region and the second trench element isolation film by implanting the n-type impurity into the second well,
wherein first base region and the second base region are arranged between the first trench element isolation film and the second well.

6. The apparatus of claim 5, further comprising:
a fifth well formed along a boundary of the semiconductor substrate by implanting the n-type impurity below the third well and below the fourth well.

7. The apparatus of claim 6, further comprising:
a third trench element isolation film formed between the first base region and the second base region.

8. The apparatus of claim 5, further comprising:
a third trench element isolation film formed between the first base region and the second base region.

* * * * *